United States Patent
Chang et al.

(10) Patent No.: US 8,254,108 B2
(45) Date of Patent: Aug. 28, 2012

(54) STORAGE MODULE FOR COMPUTER SYSTEMS

(75) Inventors: Chia-Ming Chang, Tu-Cheng (TW); Chung-Ping Liu, Tu-Cheng (TW); Chieh-Hsiang Lin, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 118 days.

(21) Appl. No.: 12/961,681

(22) Filed: Dec. 7, 2010

(65) Prior Publication Data

US 2012/0020012 A1 Jan. 26, 2012

(30) Foreign Application Priority Data

Jul. 23, 2010 (TW) ................................ 99124453 A

(51) Int. Cl.
*H05K 7/20* (2006.01)
(52) U.S. Cl. .............. 361/679.36; 361/679.46; 361/692; 361/695; 361/726; 312/223.2; 400/627; 720/619
(58) Field of Classification Search ............ 361/679.02, 361/679.33, 679.36–679.41, 679.46, 679.57, 361/679.58, 690, 695, 707, 715, 725–727
See application file for complete search history.

(56) References Cited

U.S. PATENT DOCUMENTS

| | | | |
|---|---|---|---|
| 6,111,837 A * | 8/2000 | Watanabe et al. ............. | 720/601 |
| 6,493,236 B1 * | 12/2002 | Momiyama et al. .......... | 361/756 |
| 7,465,110 B2 * | 12/2008 | Namekawa et al. .......... | 400/625 |
| 8,074,235 B2 * | 12/2011 | Kawakami .................... | 720/619 |
| 2003/0138280 A1 * | 7/2003 | Namekawa et al. .......... | 400/693 |
| 2005/0152106 A1 * | 7/2005 | Coster et al. .................. | 361/683 |
| 2005/0179757 A1 * | 8/2005 | Namekawa et al. ........... | 347/86 |

* cited by examiner

*Primary Examiner* — Courtney Smith
(74) *Attorney, Agent, or Firm* — Altis Law Group, Inc.

(57) ABSTRACT

A storage module for computer systems includes a housing defining an opening, a power supply unit and an air cooling unit, a storage unit detachably received in the housing through the opening, a bracket for mounting the storage unit, and a magnetic member. The bracket includes a tray plate defining a plurality of heat dissipation holes, a first side plate, an opposite second side plate, a stop plate including a first end detachably coupled to the second side plate and a second end pivotally connected to the first side plate, and a resilient member resiliently biasing the stop plate away from the first side plate. The storage unit is moveably and insertably positioned between the first and the second side plates. The magnetic member is positioned in one of the second side plate and the stop plate such that the second side plate and the stop plate are magnetically attracted.

10 Claims, 6 Drawing Sheets

STORAGE MODULE FOR COMPUTER SYSTEMS

BACKGROUND

1. Technical Field

The present disclosure generally relates to storage modules for computer systems, and more particularly to a storage module utilizing an air cooling unit.

2. Description of Related Art

A commonly used storage module for computer systems, such as computer servers, includes a housing, a power supply unit, a plurality of storage units, an air cooling unit, and a bracket mounting the storage units. The bracket includes a tray plate, a first side plate, an opposite second side plate, a stop plate, and a resilient member. The storage units are insertably and removably positioned between the first and second side plates. The tray plate defines a plurality of heat dissipation holes. The cooling air from the cooling unit passes through the heat dissipation holes to cool the computer system. One end of the stop plate is pivotally connected to the first side plate, and the opposite end is detachably connected to the second side plate. The resilient member connects the stop plate and the first side plate, biasing the stop plate away from the first side plate.

During installation, the storage unit is received in the housing until reaching a predetermined mounted position. In the mounted position, the stop plate is maintained between the first side plate and the storage unit and resists the storage unit. When the storage unit is drawn out of the housing, the stop plate is rotated by the resilient force of the resilient member. However, the resilient force is gradually decreased as the stop plate approaches the second side plate. The stop plate cannot tightly contact the second side plate, because the resilient force is minimized. As a result, the stop plate will unduly generate oscillation when cool air is applied therein, affecting the common operation of the storage module. One method for increasing the contact between the stop plate and the second side plate is to increase the resilient force of the resilient member. However, during the installation of the storage unit, more resistance makes it inconvenient to operate.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
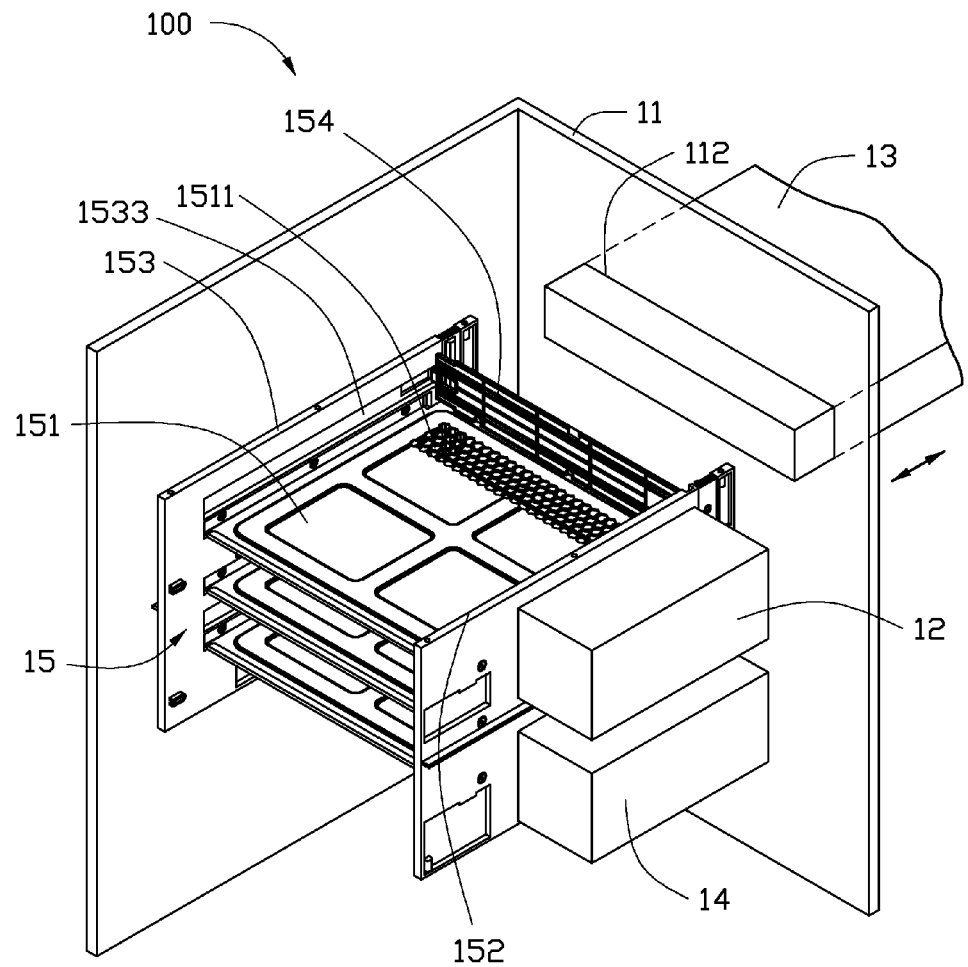
FIG. 1 is an isometric view of one embodiment of a storage module for computer systems shown in an installation state, the storage module includes a housing, a storage unit, a bracket, a top plate, and a resilient member.

Referring to FIG. 1, one embodiment of a storage module for computer systems 100 includes a housing 11, a power supply unit 12, one or more storage units 13 removably received in the housing 11, an air cooling unit 14 to cool the computer system, and a bracket 15 to carry the one or more storage units 13. The housing 11 defines one or more installation openings 112 corresponding to the storage units 13. In the illustrated embodiment, only one storage unit 13 and one corresponding installation opening 112 are shown.

Figure 2:
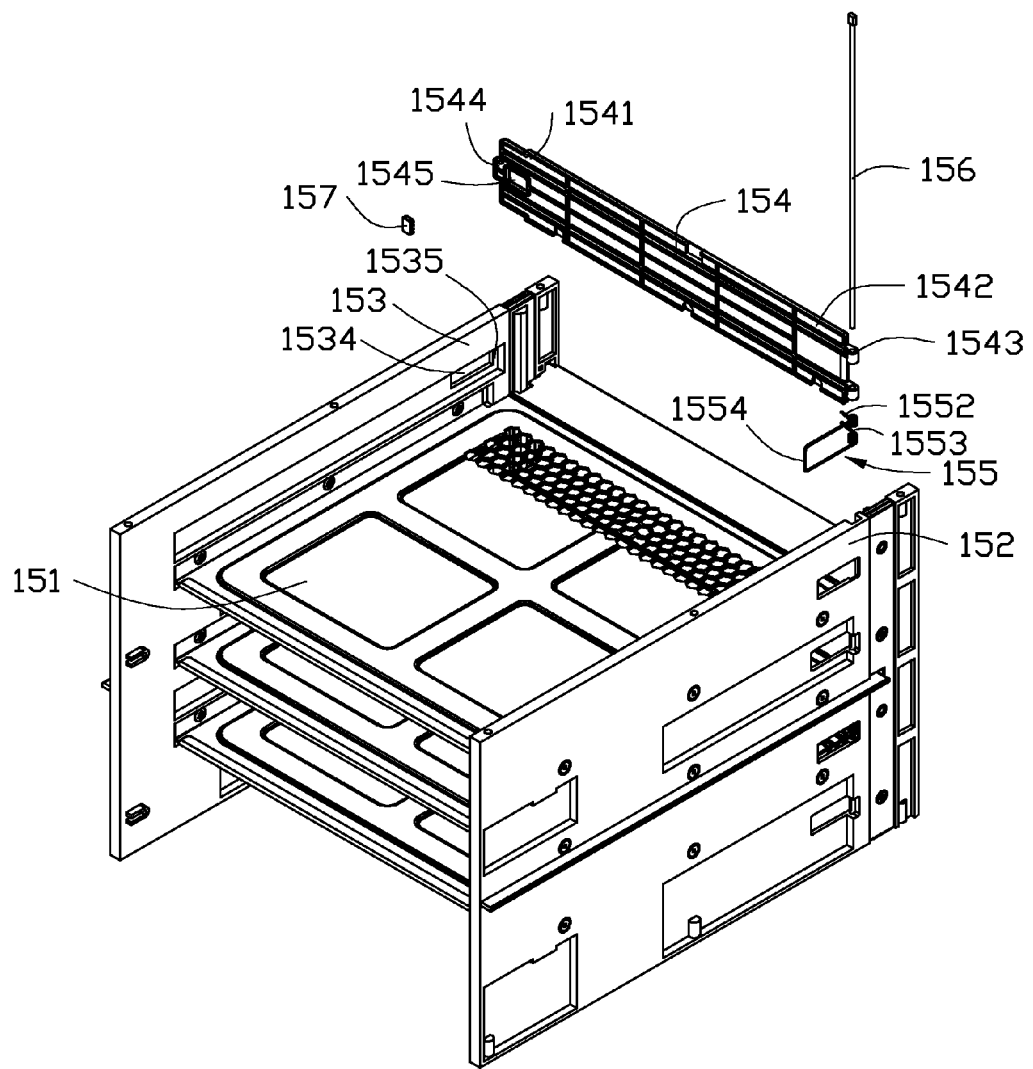
FIG. 2 is a partially exploded, isometric view of the storage module for computer systems of FIG. 1.
Figure 3:
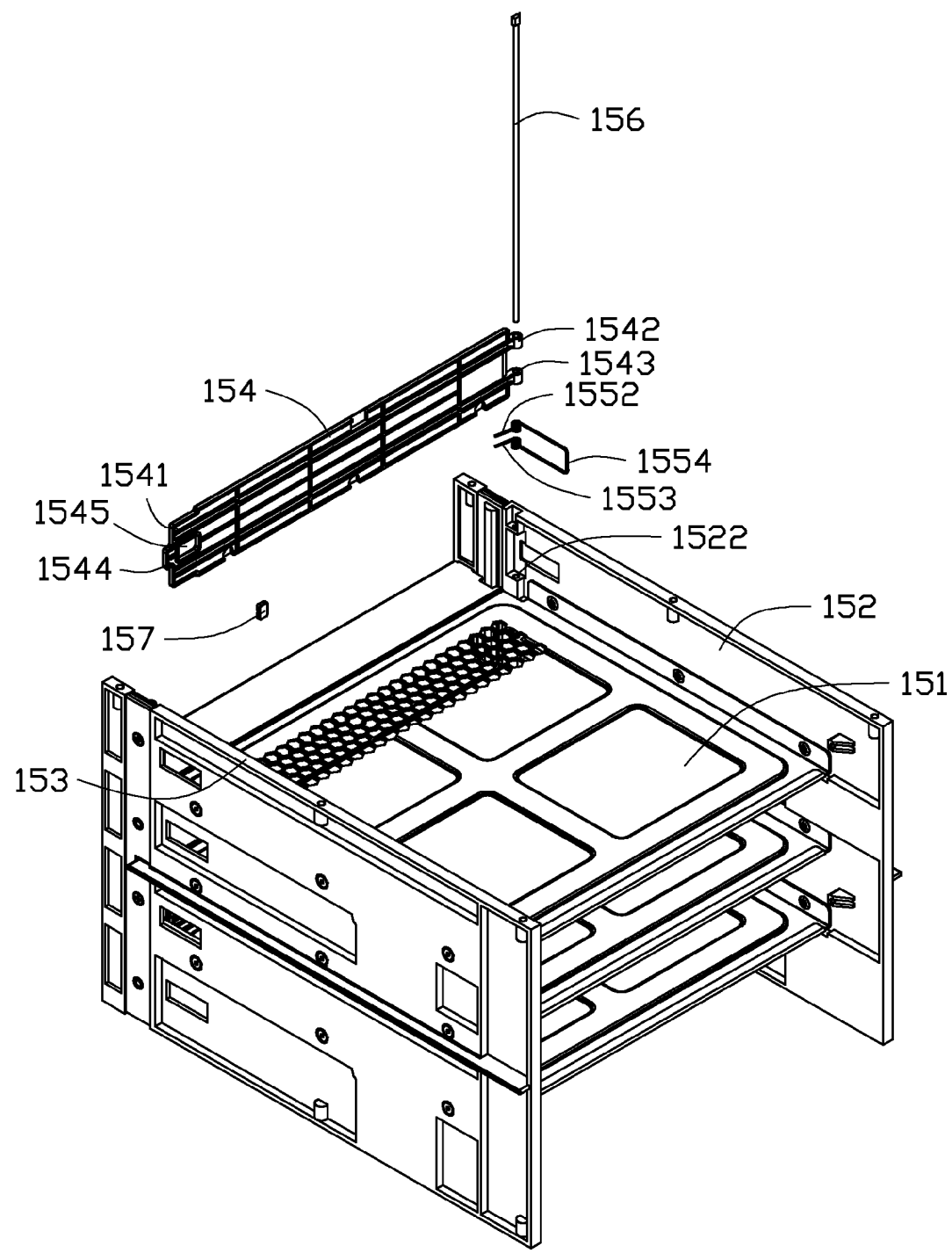
FIG. 3 is similar to FIG. 2, but viewed from another aspect.

Referring to FIGS. 2 and 3, the bracket 15 includes a tray plate 151, a first side plate 152, a second side plate 153 opposite to the first side plate 152, a cover plate 154, and a resilient member 155. The first and second side plates 152, 153 are positioned on opposite sides of the tray plate 151.

The tray plate 151 defines a plurality of heat dissipation holes 1511 which are closely arranged. The cooling air from the air cooling unit 14 passes through the heat dissipation holes 1511 to form a plurality of cooling-air streams. The storage unit 13 is positioned between the first and second side plates 152, 153, and is removable and insertable along the longitudinal axis of the first plate 152. In the illustrated embodiment, the storage unit 13 conforms to the storage bridge bay ("SBB") standard.

The cover plate 154 includes a first end 1541 detachably coupled to the second side plate 153, and a second end 1542 opposite to the first end 1541. The second end 1542 is pivotally connected to an end of the first side plate 152. The resilient member 155 is configured to supply an elastic force biasing the cover plate 154 away from the first side plate 152, such that when the storage unit 13 is drawn out of the housing 11, the stop plate 154 is rotated toward the second side plate 153 by the elastic force, until the first end 1541 contacts the second side plate 153.

In the illustrated embodiment, the second end 1542 defines a pivot hole 1543, and the first side plate 152 defines a receiving hole 1522. The storage module for computer systems 100 further includes a pivot shaft 156 passing through the pivot hole 1543 and the receiving hole 1522, so as to pivotally connect the stop plate 154 and the first side plate 152. The resilient member 155 is a torsion spring positioned around the pivot shaft 156, and includes a first connecting end 1552, a second connecting end 1553, and a U-shaped arm 1554 connecting the first and second connecting ends 1552, 1553. The first and second connecting ends 1552, 1553 resist the second end 1542 of the stop plate 154, and the U-shaped arm 1554 resists the first side plate 152, such that the resilient member 155 can supply a resilient force biasing the stop plate 154 away from the second side plate 153. In other embodiments, the resilient member 155 can be any other component capable of supplying a resilient force.

The storage module for computer systems 100 further includes a magnetic member 157 positioned in one of the second side plate 153 and the first end 1541 of the stop plate 154, while the other one is capable of being magnetically attracted by the magnetic member 157. When contacting the second side plate 153, the stop plate 154 can tightly couple to the second side plate 153 by the magnetic force therebetween. Assisting the magnetic force, a smaller resilient force of the resilient member 155 tightly contacts the stop plate 154 and the second side plate 153. Therefore, during the installation of the storage unit 13, when the stop plate 154 is detached from the second side plate 153, minimal force is required to overcome the resilient force of the resilient member 155 to move the storage unit 13, thus facilitating ease of operation.

In the illustrated embodiment, an inner surface 1533 of the second side plate 153 defines a groove 1534. The groove 1534 has a contact surface 1535 to stop the first end 1541 of the stop plate 154. The first end 141 includes a protrusion portion 1544 extending from an edge thereof. The protrusion portion 1544 defines a receiving groove 1545 to receive the magnetic member 157. The second side plate 153 is made of magnetic materials, so that when the stop plate 154 contacts the second side plate 153, the magnetic member 157 is tightly coupled to the contact surface 1535 by a magnetic force.

Figure 4:
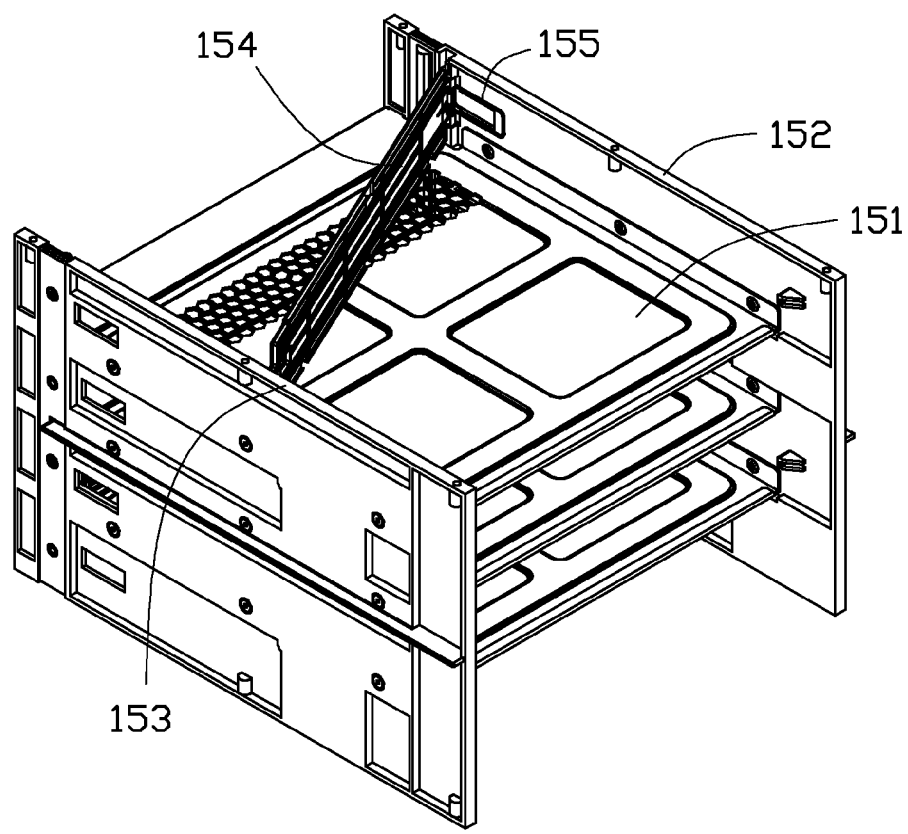
FIG. 4 is an isometric view of the stop plate of the storage module of FIG. 1 in a rotation state.
Figure 5:
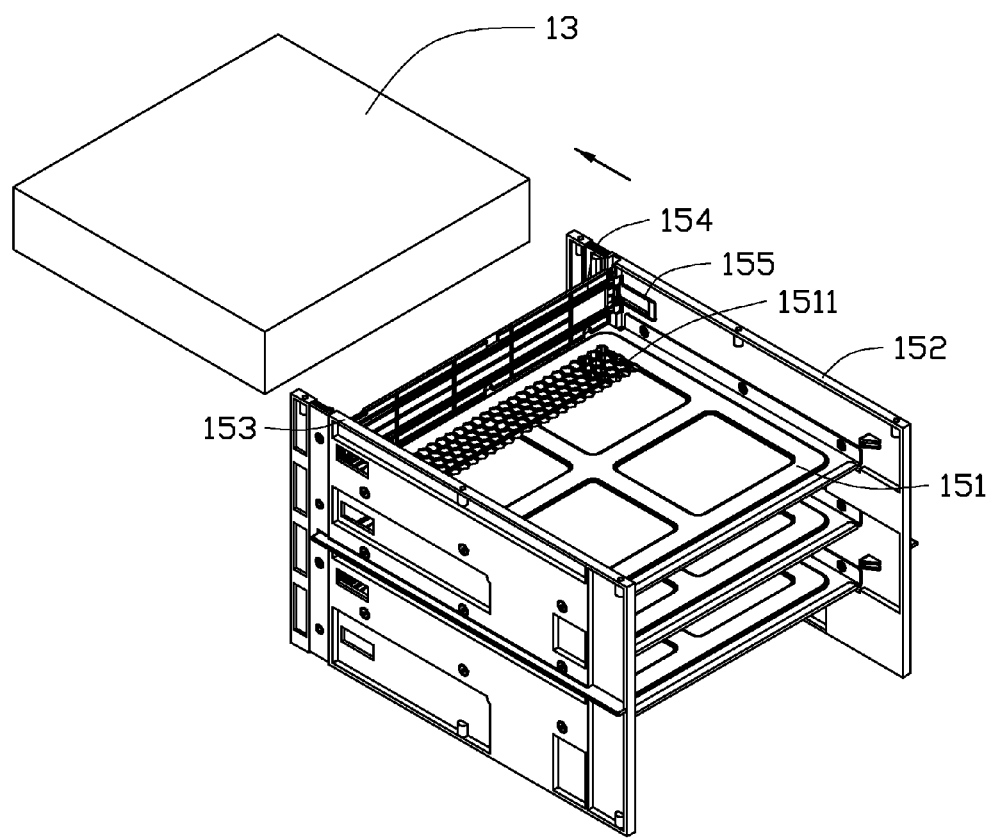
FIG. 5 is an isometric view of the storage unit of the storage module of FIG. 1 in an installation state.
Figure 6:
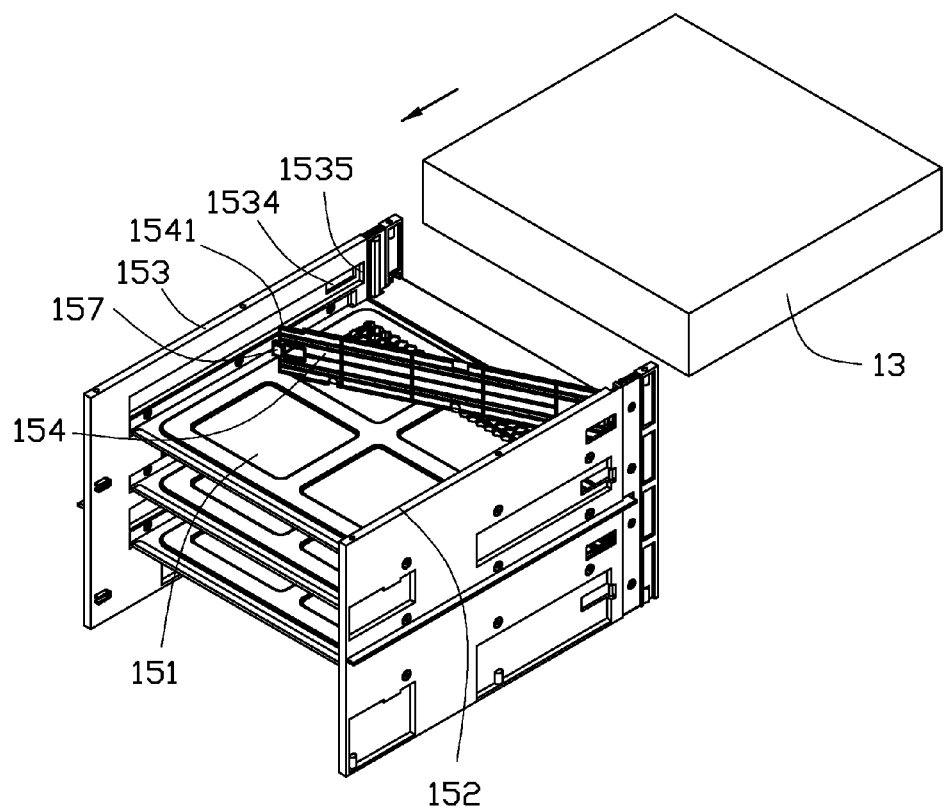
FIG. 6 is an isometric view of the storage unit of the storage module of FIG. 1 in a retrieval state.

Referring to FIGS. 4 through 6, during installation, the storage unit 13 is received in the housing 11 into a mounted position. In the mounted position, the stop plate 154 is positioned between the first side plate 152 and the storage unit 13 and resists the storage unit 152. After the storage unit 13 is drawn out of the housing 11, the stop plate 154 is rotated toward the second side plate 153 by the resilient member 155 until contacting the second side plate 153. The magnetic force generated between the magnetic member 157 and the second side plate 153 can tightly couple the first end 154 of the stop plate 154 to the second side plate 153, thus preventing the oscillation of the stop plate 154 caused by the air flowing of the air cooling unit 14 through the heat dissipation holes 1511.

It should be understood that in other embodiments the storage module for computer systems 100 can include two magnetic members positioned in the second side plate 153 and the stop plate 154, respectively, such that the stop plate 153 can be coupled to the second side plate 153 more tightly by the attraction of the two magnetic members. One of the magnetic members can be positioned in the groove 1534, and the other can be positioned in the receiving groove 1545.

It is believed that the present embodiments and their advantages will be understood from the foregoing description, and it will be apparent that various changes may be made thereto without departing from the spirit and scope of the disclosure or sacrificing all of its material advantages.

The invention claimed is:

1. A storage module for computer systems, the storage module comprising:
    a housing defining an opening;
    a power supply unit and an air cooling unit received in the housing;
    a storage unit detachably received in the housing through the opening;
    a bracket carrying the storage unit; and
    at least one magnetic member;
    wherein the bracket comprises a tray plate defining a plurality of heat dissipation holes, a first side plate, a second side plate opposite to the first side plate, a stop plate comprising a first end detachably coupled to the second side plate and a second end pivotally connected to the first side plate, and a resilient member biasing the stop plate away from the first side plate, the storage unit is moveably and insertably positioned between the first and second side plates, and the at least one magnetic member is positioned in at least one of the second side plate and the stop plate such that the second side plate and the stop plate are magnetically attracted.

2. The storage module of claim 1, wherein the at least one magnetic member comprises a magnetic member fixed in the first end of the stop plate, and the second side plate is made of magnetic material magnetically attracted by the magnetic member.

3. The storage module of claim 2, wherein the first end forms a protrusion to contact the second side plate, and the protrusion defines a receiving groove for receiving the magnetic member.

4. The storage module of claim 1, further comprising a pivot shaft, wherein the second end defines a pivot hole, and the first side plate defines a receiving hole; the pivot shaft is received in the pivot hole and the receiving hole to pivotally connect the stop plate and the first side plate.

5. The storage module of claim 4, wherein the resilient member is a torsion spring positioned around the pivot shaft.

6. The storage module of claim 5, wherein the resilient member comprises a first connecting end, a second connecting end, and a U-shaped arm connecting the first and the second connecting ends; the first and second connecting ends resist the stop plate, and the U-shaped arm resists the first side plate.

7. The storage module of claim 1, wherein the storage unit conforms to a storage bridge bay standard.

8. The storage module of claim 1, wherein an inner surface of the second side plate defines a groove having a contact surface to contact the stop plate.

9. The storage module for computer systems of claim 1, wherein the at least one magnetic member comprises two magnetic members positioned in the first end of the stop plate and the second side plate, respectively.

10. A storage module for computer systems, comprising:
    a housing defining an opening;
    a power supply unit and an air cooling unit received in the housing;
    a storage unit detachably received in the housing through the opening;
    a bracket carrying the storage unit; and
    at least one magnetic member;
    wherein the bracket comprises a tray plate defining a plurality of heat dissipation holes, a first side plate, a second side plate opposite to the first side plate, a stop plate comprising a first end detachably coupled to the second side plate and a second end pivotally connected to the first side plate, and a resilient member resiliently biasing the stop plate away from the first side plate; the storage unit is moveably and insertably positioned between the first and the second side plates; the at least one magnetic member is positioned in at least one of the second side plate and the stop plate such that the second side plate and the stop plate are magnetically attracted; when the storage unit is drawn out of the housing, the stop plate is rotated toward the second side plate by the resilient member until contacting the second side plate; the first end of the stop plate is capable of being tightly coupled to the second side plate by a magnetic force, thus preventing an oscillation of the stop plate caused by air flowing of the air cooling unit through the heat dissipation holes.

* * * * *